(12) United States Patent
Smith

(10) Patent No.: US 6,466,044 B1
(45) Date of Patent: Oct. 15, 2002

(54) THROUGH CONNECTOR CIRCUIT TEST APPARATUS

(75) Inventor: Lonnie W. Smith, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/533,451

(22) Filed: Mar. 23, 2000

Related U.S. Application Data

(63) Continuation-in-part of application No. 09/425,911, filed on Oct. 21, 1999, now Pat. No. 6,255,834.

(51) Int. Cl.$^7$ ............................................. G01R 31/02
(52) U.S. Cl. ..................... 324/755; 361/767; 324/754
(58) Field of Search ................ 324/538, 754, 324/761, 762, 755, 72.5, 73 R; 439/378, 331; 361/767

(56) References Cited

U.S. PATENT DOCUMENTS

| | | | |
|---|---|---|---|
| 4,357,575 A | | 11/1982 | Uren |
| 4,783,624 A | | 11/1988 | Sabin |
| 4,866,375 A | | 9/1989 | Malloy |
| 4,906,920 A | | 3/1990 | Huff |
| 4,985,107 A | | 1/1991 | Conroy |
| 5,055,055 A | | 10/1991 | Bakker |
| 5,092,774 A | * | 3/1992 | Milan |
| 5,136,237 A | | 8/1992 | Smith |
| 5,159,265 A | | 10/1992 | Alfonso |
| 5,204,615 A | | 4/1993 | Richards |
| 5,273,463 A | | 12/1993 | Kaetsu |
| 5,374,204 A | | 12/1994 | Foley |
| 5,436,568 A | | 7/1995 | Woith |
| 5,440,235 A | * | 8/1995 | Oko |
| 5,447,442 A | | 9/1995 | Swart |
| 5,461,326 A | | 10/1995 | Woith |
| 5,485,096 A | | 1/1996 | Aksu |
| 5,633,597 A | | 5/1997 | Stowers |
| 5,670,884 A | | 9/1997 | Kodama |
| 5,689,191 A | * | 11/1997 | Kashiyama |
| 5,698,990 A | | 12/1997 | Aussant |
| 5,701,079 A | | 12/1997 | Yagi |
| 5,760,592 A | * | 6/1998 | Kodama |
| 5,831,438 A | * | 11/1998 | Okura |
| 5,923,180 A | | 7/1999 | Botka |
| 6,123,574 A | * | 9/2000 | Matsuda |

\* cited by examiner

*Primary Examiner*—Michael J. Sherry
*Assistant Examiner*—Trung Q. Nguyen
(74) *Attorney, Agent, or Firm*—Haynes and Boone, LLP

(57) ABSTRACT

An apparatus including a plurality of bodies with a first one of the bodies being spaced apart from a second one of the bodies. A retaining member extends through the first one of the bodies. A first end of the retaining member is maintained in fixed relationship with respect to the second one of the bodies. A head on a second end of the retaining member is provided. The head includes a self-centering portion engaging a mating self-centering portion attached to the first one of the bodies. A resilient member is engaged between the first one of the bodies and the second one of the bodies for biasing the self-centering portion of the first one of the bodies into engagement with the mating self-centering portion of the head.

17 Claims, 4 Drawing Sheets

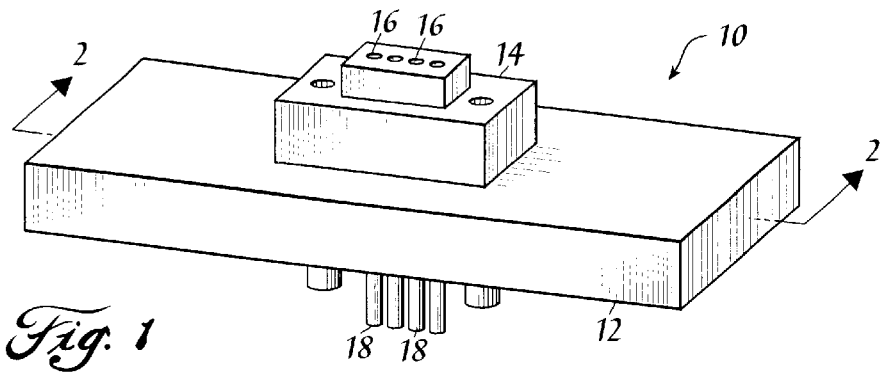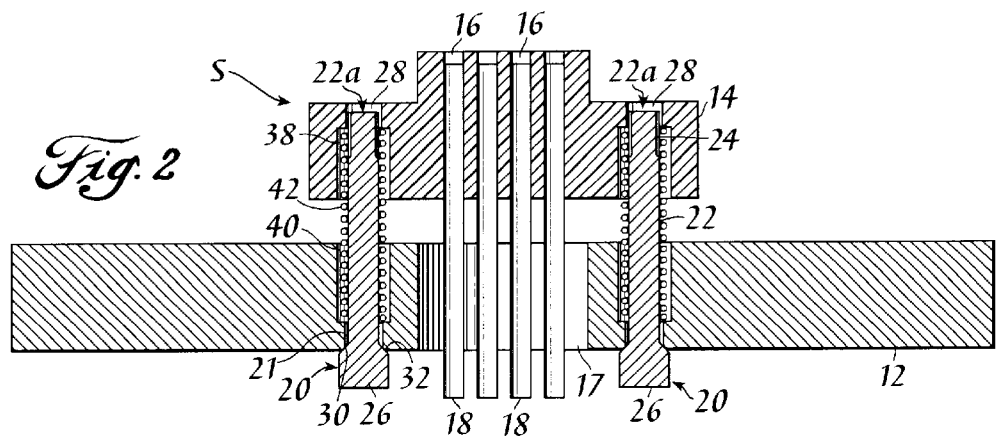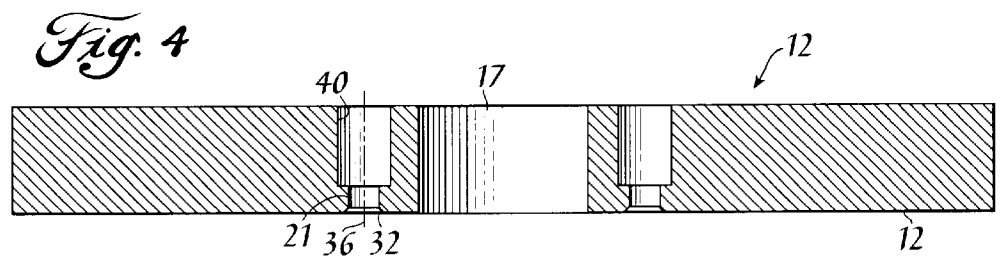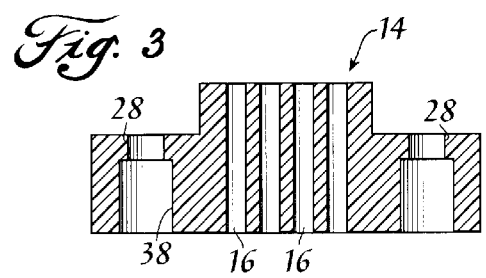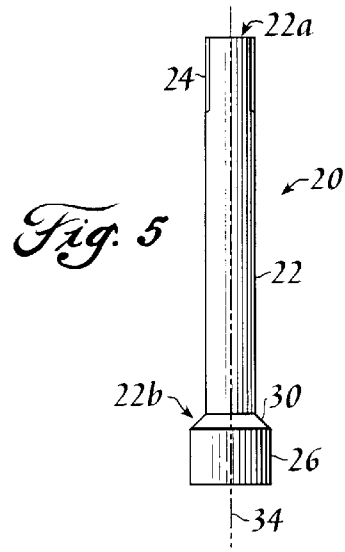

THROUGH CONNECTOR CIRCUIT TEST APPARATUS

CROSS REFERENCE TO RELATED APPLICATION

This application is a continuation-in-part of U.S. patent application Ser. No. 09/425,911, filed on Oct. 21, 1999, now U.S. Pat. No. 6,255,834 by Lonnie W. Smith, entitled THROUGH CONNECTOR CIRCUIT TEST APPARATUS.

BACKGROUND

The disclosures herein relate generally to electronic test equipment and more particularly to a through connector circuit test apparatus.

Many electronic devices often include electronic assemblies such as printed circuit boards (PCB's) that have one or more electrical connectors. To ensure that the electronic assembly is properly assembled, a through connector test sequence may be used to verify the operation of the electronic assembly. In this type of test, a circuit test apparatus is attached to one or more connectors of the electronic assembly.

Due to manufacturing tolerances, the connectors are not always positioned at the same location. The inconsistent positioning of these connectors can adversely affect the ability to use an automated circuit test apparatus to test the device. To compensate for variations in positioning, certain circuit test apparatus is often designed to float and to be self-centering. The floating feature allows the connector to translate to accommodate slight misalignments between the test connector of the fixture and the connector of the assembly being tested. The self-centering feature ensures that the connector returns to a nominal position when the fixture is disengaged from the electronic device being tested.

U.S. Pat. No. 5,831,438 discloses a device for testing a connector which has a plurality of terminals, each one of the terminal being mounted in a respective terminal chamber. There is a flexing space adjacent to each chamber and a resilient tongue, biased into the chamber. The resilient tongue is moved into the space as the terminals are inserted and springs out of the space when they are fully within their respective chambers. The device has a plurality of testing units attached within a body which is movable toward and away from the connector. If at least one of the terminals is not fully inserted into its chamber, the body is moved backward away from the connector so that contact between the units and the terminals is not made.

U.S. Pat. No. 5,698,990 discloses a counterforce spring assembly for printed circuit board test fixtures. A number of counterforce spring assemblies are provided in an array between the top plate and probe plate of the test fixture. Each counterforce spring assembly includes a support cup residing in an aperture through the probe plate. A compression spring resides in the support cup and provides spring-biasing of the top plate to the probe plate during the testing cycle. Each counterforce spring assembly includes a circumferential flange to limit downward travel of the top plate toward the probe plate. Each assembly is small enough to fit between probe apertures corresponding to component leads of the device being tested. The counterforce spring assemblies can be freely placed underneath the top plate to provide even spring-biasing thereof to prevent bowing and bending of the top plate which often causes errors in the testing of printed circuit boards.

U.S. Pat. No. 5,461,326 discloses a test probe including a flexible membrane having an array of test probe contacts. The test probe is capable of softly and gently contacting pads on a device under test with a structure that effectively applies tension to the membrane while at the same time automatically leveling the membrane and removing distortions. A small pressure plate is bonded to the inner surface of the membrane behind the test probe contacts. A pressure post having a pointed or rounded end is pressed against the pressure plate and makes pivotal contact with the plate. A spring including an adjustment screw that axially adjusts the compression of the spring, applies pressure through the pivot point to the pressure plate and to the membrane at its test probe contacts. When the probe contacts are pressed against a device to be tested, the probe contacts and the pressure plate rotate about the pivot point of the pressure post. This action planarizes the test probe contact array and levels the test contact array while appropriately tensioning the membrane.

U.S. Pat. No. 5,159,265 discloses a pivotable spring probe that includes a housing having an opening including a plunger that is guided by the housing. The plunger is slidably movable between an extended position and a retracted position. A pivotable contact head is mounted on the plunger for making electrical contact with a conductive surface external to the housing. A spring is mounted on the bottom of the plunger for biasing the plunger toward the housing opening.

U.S. Pat. No. 4,357,575 discloses an improved testing fixture apparatus for use in accurately effecting temporary electrical connections with the test point zones of printed circuit boards or the like. The board to be tested is mounted upon a locator assembly that is shiftably receivable within the fixture. The fixture includes a centering and gripping mechanism operative in conjunction with a cooperative part carried by the contact bearing portion of the fixture. The centering and gripping mechanism automatically positions the locator assembly and printed circuit board in a predetermined location within the fixture. This positioning assures precise alignment of a contact with each of the test point zones of the printed circuit board to be tested. The positioning action of the mechanism and its cooperating part includes both a centering function and a gripping function therebetween. Both of the functions occur automatically in response to relative shifting of the portions of the fixture for respectively supporting the printed circuit board and the contacts toward each other into an operative relationship for affecting electrical connections between the test point zones of the printed circuit board and corresponding contacts of the fixture.

The floating and self-centering functionality of a test connector may degrade over time. After prolonged use, some conventional test connectors develop a positional bias which returns the connector to an offset, non-centered nominal position. As the test connector is not able to properly mate with the corresponding connector of the device being tested, the test apparatus of the device being tested is often damaged.

Accordingly, there is a need for a through connector circuit test apparatus that exhibits accurate and reliable floating and self-centering operation to overcome the shortcomings of previous test connectors.

SUMMARY

One embodiment, accordingly, provides a test apparatus that reliably mates with a corresponding connector of an electronic device to facilitate testing of the device. To this end, one embodiment provides an apparatus including a connector body and a fixture body positioned adjacent to a first side of the connector body. A retaining member extends through the connector body. A first end of the retaining member is attached to the fixture body. A head on a second end of the retaining member includes a tapered portion. The tapered portion of the head engages a tapered seat on a second side of the connector body. A resilient member is engaged between the fixture body and the connector body.

A principal advantage of this embodiment is that the second body accurately and reliably returns to its nominal position when disengaged from the device being tested.

BRIEF DESCRIPTION OF THE DRAWING FIGURES

FIG. 1 is a perspective view illustrating an embodiment of a test apparatus according to the present disclosure.

FIG. 2 is a cross sectional view taken along the line 2—2 in FIG. 1.

FIG. 3 is a cross sectional view illustrating an embodiment of a second body.

FIG. 4 is a cross sectional view illustrating an embodiment of a first body.

FIG. 5 is a side view illustrating an embodiment of a retaining member.

DETAILED DESCRIPTION

Figure 6:
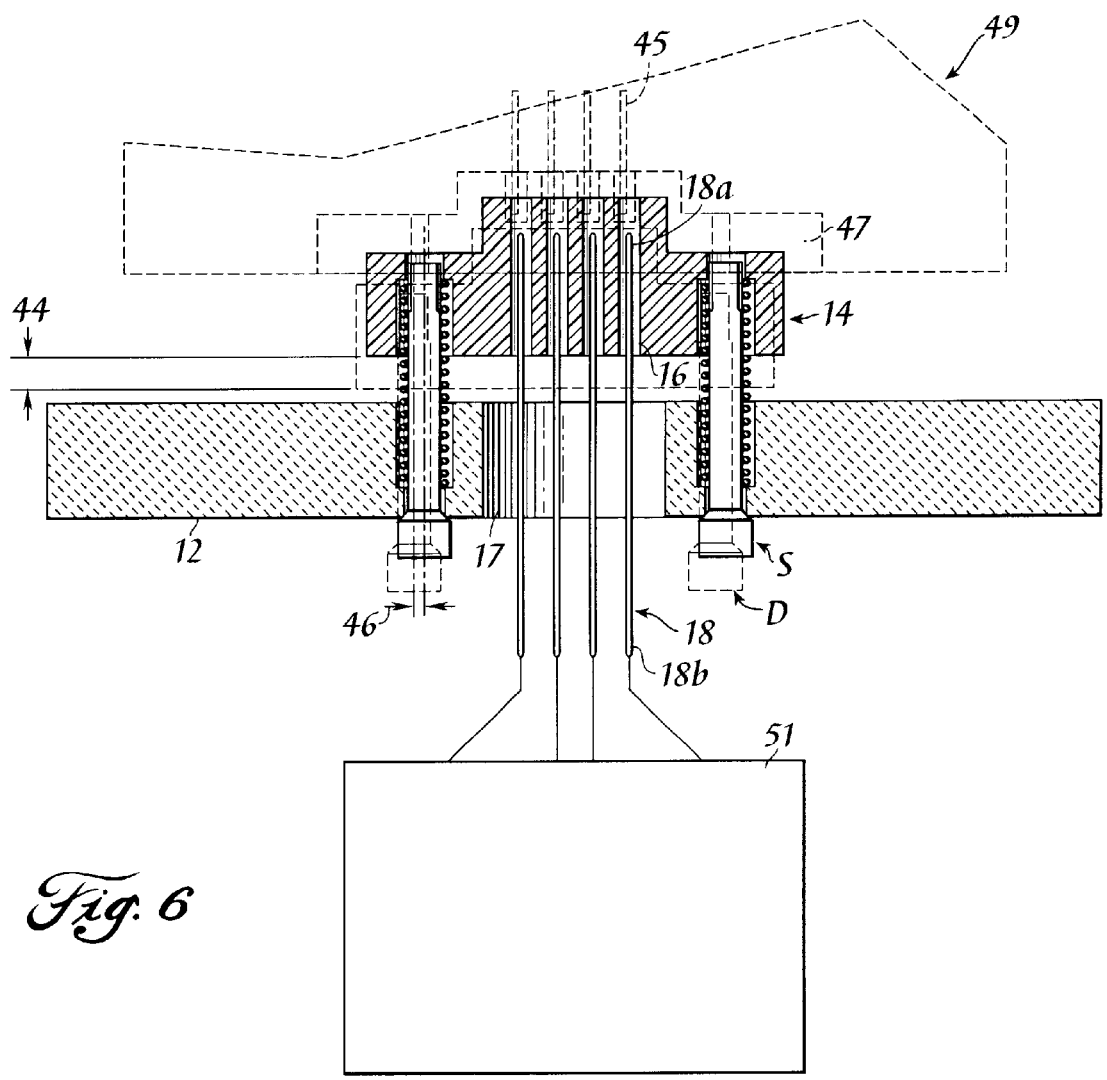
FIG. 6 is a diagrammatic view illustrating a displacement of the second body with respect to the fixture body.

An embodiment of a test apparatus 10 for conducting through connector testing of a device such as a motherboard of a computer is illustrated in FIG. 1. The test apparatus 10 includes a first body 12, such as, for example, a fixture body and a second body 14 such as, for example, a connector body movably attached to the first body 12. A plurality of passages 16 are formed through the second body 14 and a probe 18 is received in each one of the passages 16.

Now referring to FIGS. 2–5, the second body 14 is attached to the first body 12 by a plurality of retaining members, such as the spaced apart sleeves 20 illustrated in FIG. 2. Each one of the sleeves 20 includes a shaft portion 22 having a threaded portion 24 formed at a first end 22a of the shaft portion 20 and a head 26 attached to a second end 22b of the shaft portion 20. The first end 22a of the shaft portion 22 of each one of the sleeves 20 passes through a corresponding bore 21 in the first body 12. The threaded portion 24 of each one of the sleeves 20 is fastened in a corresponding threaded hole 28 formed in the second body 14. The bore 21 has a diameter larger than a diameter of the shaft portion 22 of each one of the sleeves 20. The head 26 of each one of the sleeves 20 includes a tapered portion 30 that engages a corresponding tapered seat 32 formed in the first body 12. Tapered as used herein is defined to include linearly tapered surfaces (i.e. a taper with a straight cross-sectional profile) and non-linearly tapered surfaces (i.e. a taper with a contoured cross-sectional profile). The tapered portion 30 of each one of the sleeves 20 defines a longitudinal axis 34, FIG. 5. Each tapered seat 32 defines a reference axis 36, FIG. 4. When the second body 14 is in a static position S with respect to the first body 12, FIG. 2, the longitudinal axis 34 of each one of the sleeves 20 is substantially aligned with the reference axis 36 of the corresponding tapered seat 32.

The second body 14 includes a cavity 38 adjacent to the threaded hole 28, FIG. 3. The first body 12 includes a cavity 40 adjacent to the bore 21, FIG. 4. Each sleeve 20 axially carries a resilient member 42 such as a helically wound spring. Each resilient member 42 is compressed between the second body 14 and the first body 12 such that the second body 14 is biased to the static position S, FIG. 2.

The first body 12 is made of a metal or polymeric material that exhibits a relatively high flexural strength such as aluminum or a fiber reinforced polyester. It is essential that the probes 18 be mounted in the second body 14 in a manner in which they are electrically isolated. To this end, the second body 14 is made of a non-conductive material such as a non-conductive polymeric material or a non-conductive ceramic material. Alternately, the second body 14 may be made of a conductive material with the probes 18 mounted in an insulated manner with respect to the second body 14.

Referring now to FIG. 6, a first end 18a of each one of the probes 18 is mounted in a respective one of the passages 16 for engaging a contact pin 45 in a connector 47 of a device 49 being tested. A second end 18b of each probe 18 extends from the second body 14 through an opening 17 in the first body 12. The probes 18 can be connected between the device 49 and a data acquisition device 51 for acquiring and analyzing various electrical data for the device 49. A typical aspect or performance that is analyzed during testing is whether all of the components of the device being tested have been successfully connected to other related components. For example, it is common to test a motherboard to ensure that various component connectors such as that for a microprocessor has been successfully connected to various input and output connects located at an edge of the motherboard.

Still referring to FIG. 6, the second body 14 is movable between the static position S and a displaced position D. In the case of the second body 14 being perfectly aligned with a connector 47 of the device 49, the engagement of the second body 14 with the connector 47 of the device 49, will result in only an axial displacement 44 of the second body 14 relative to the first body 12. However, in most instances, the second body 14 is not perfectly aligned with the connector 47 of the device 49. As a result, the second body 14 also experiences a radial displacement 46 relative to the first body 12 when the second body 14 is engaged with the connector 47 of the device 49.

It is a key aspect of embodiments according to the present disclosure that the connector body 14 exhibits self-centering characteristics such that it repeatedly and accurately returns to a nominal position. In the past, self-centering functionality has been difficult to achieve over extended periods of use and when wires and/or a connector are attached to the probes 18. It is also a key aspect of embodiments of the present disclosure that the connector body 14 be able to float freely with respect to the fixture body 12.

Figure 7:
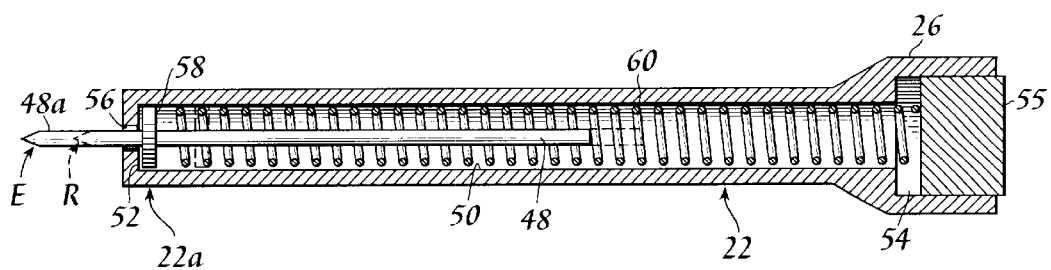
FIG. 7 is a cross sectional view illustrating an alternate embodiment of an alignment pin mounted in the retaining member.
Figure 8:
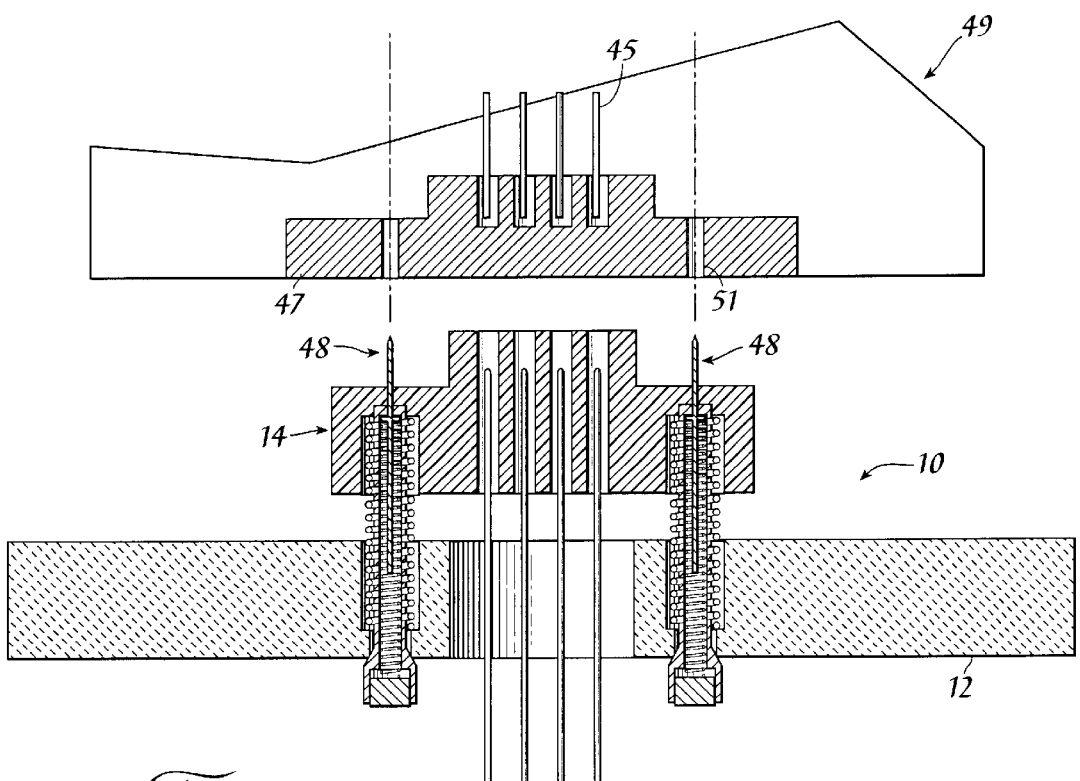
FIG. 8 is a cross sectional view illustrating two alignment pins attached to a test apparatus.

Another embodiment of a test apparatus 10 including a pair of spaced apart alignment pins 48 is illustrated in FIGS. 7 and 8. In some applications, the alignment pin 48 is used to locate the second body 14 relative to a locating feature 51, FIG. 8, of the device 49. A common locating feature 51 is a screw hole in the connector 47 of the device 49. When the test apparatus 10 is moved toward the device 49, the alignment pins 48 engage respective locating features 51 to align with second body 14 with respect to the connector 47 of the device 49.

As illustrated in FIG. 7, the sleeve 20 includes a channel 50 having a shoulder 52 adjacent to the first end 22a and a counter-bored portion 54 in the head 26 of the sleeve 20. A plug 55 is fixedly mounted in the counter-bored portion 54 of the head 26 by a method such as a press fit, adhesive, threads, swagging or other known methods. A hole 56 is formed through the shoulder 52. The alignment pin 48 is positioned in the channel 50 with a tip portion 48a extending through the hole 56. The alignment pin includes a flange 58 within the channel 50. A resilient member 60 such as a helically wound spring is compressed between the flange 58 and the plug 55 for biasing the alignment pin 48 to an extended position E. The alignment pin 48 is movable between the extended position E and a retracted position R.

Figure 9:
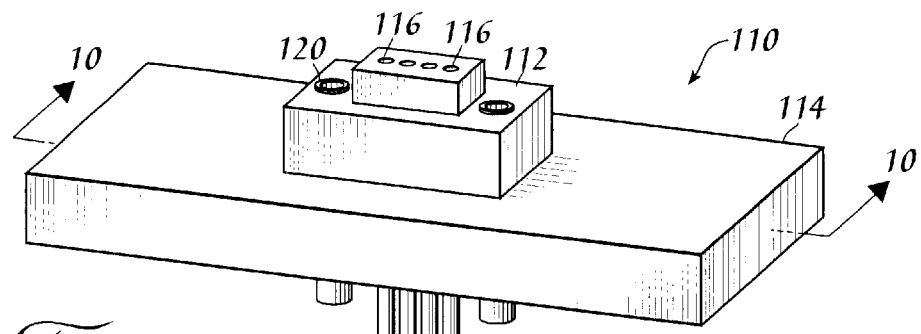
FIG. 9 is a perspective view illustrating another embodiment of a test apparatus according to the present disclosure.
Figure 10:
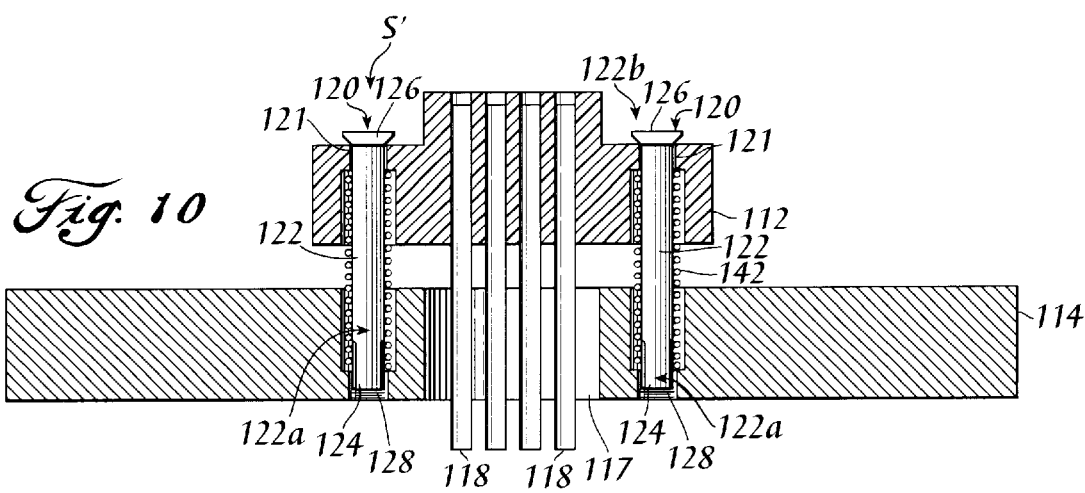
FIG. 10 is a cross sectional view taken along the line 10—10 in FIG. 9.

A further embodiment of a test apparatus 110 for conducting through connector testing of a device such as a motherboard of a computer is illustrated in FIG. 9. The test apparatus 110 includes a first body 112, such as, for example, a connector body and a second body 114 such as, for example, a fixture body movably attached to the first body 112. A plurality of passages 116 are formed through the first body 112 and a probe 118 is received in each one of the passages 116.

Now referring to FIGS. 10–13, the second body 114 is attached to the first body 112 by a plurality of spaced apart sleeves 120. Each one of the sleeves 120 includes a shaft portion 122 having a threaded portion 124 formed at a first end 122a of the shaft portion 122 and a head 126 attached to a second end 122b of the shaft portion 122. The first end 122a of the shaft portion 122 of each one of the sleeves 120 passes through a corresponding bore 121 in the first body 112. The threaded portion 124 of each one of the sleeves 120 is fastened in a corresponding threaded hole 128 formed in the second body 114. The bore 121 has a diameter larger than a diameter of the shaft portion 122 of each one of the sleeves 120. The head 126 of each one of the sleeves 120 includes a tapered portion 130, FIG. 13, that engages a corresponding tapered seat 132, FIG. 12, formed in the first body 112.

Figure 13:
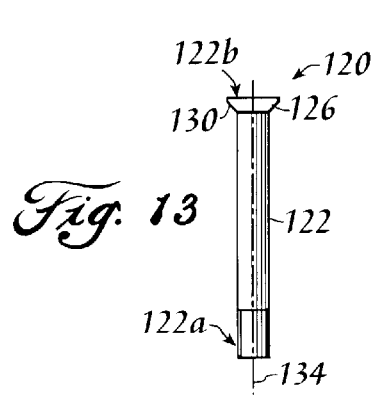
FIG. 13 is a side view illustrating an embodiment of the retaining member of the test apparatus of FIG. 9.

The tapered portion 130 of each one of the sleeves 120 defines a longitudinal axis 134, FIG. 13. Each tapered seat 132 defines a reference axis 136, FIG. 12. When the first body 112 is in a static position S' with respect to the second body 114, FIG. 10, the longitudinal axis 134 of each one of the sleeves 120 is substantially aligned with the reference axis 136 of the corresponding tapered seat 132.

Figure 11:
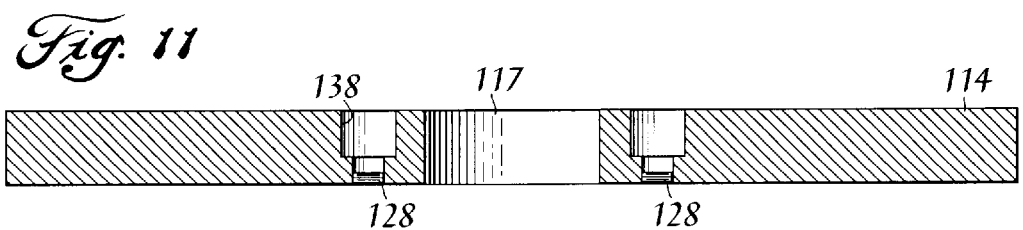
FIG. 11 is a cross sectional view illustrating an embodiment of the second body of the test apparatus of FIG. 9.
Figure 12:
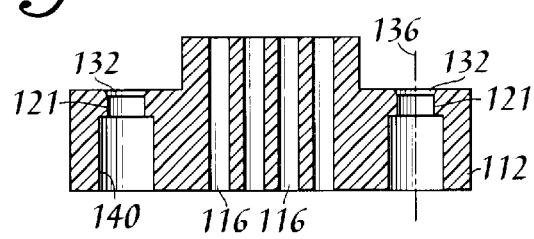
FIG. 12 is a cross sectional view illustrating an embodiment of the first body of the test apparatus of FIG. 9.

The second body 114 includes a cavity 138 adjacent to the threaded hole 128, FIG. 11. The first body 112 includes a cavity 140 adjacent to the bore 121, FIG. 12. Each sleeve 120 axially carries a resilient member 142, FIG. 10, such as a helically wound spring. Each resilient member 142 is compressed between the second body 114 and the first body 112 such that the first body 112 is biased to the static position S', FIG. 10.

As a result, one embodiment provides an apparatus including a connector body and a fixture body positioned adjacent to a first side of the connector body. A retaining member extends through the connector body. A first end of the retaining member is attached to the fixture body. A head on a second end of the retaining member includes a tapered portion. The tapered portion of the head engages a tapered seat on a second side of the connector body. A resilient member is engaged between the fixture body and the connector body.

Another embodiment provides an apparatus including a plurality of bodies with a first one of the bodies being spaced apart from a second one of the bodies. A retaining member extends through the first one of the bodies. A first end of the retaining member is maintained in fixed relationship with respect to the second one of the bodies. A head on a second end of the retaining member is provided. The head includes self-centering portion engaging a mating self-centering portion attached to the first one of the bodies. A resilient member is engaged between the first one of the bodies and the second one of the bodies for biasing the self-centering portion of the first body into engagement with the mating self-centering portion of the head.

A further embodiment provides a through connector test apparatus including a first body and a second body wherein the first body is spaced apart from the second body. An alignment member is attached to the first body and engages a mating alignment member of the second body for centering the first body with respect to the second body. A resilient member is engaged between the first body and the second body for biasing the alignment member into engagement with the mating alignment member.

Yet another embodiment provides a through connector test apparatus including a plurality of bodies. A means is provided for attaching a first one of the bodies to a second one of the second bodies such that the first one of the bodies is movable between a static position and a displaced position with respect to the second one of the bodies. The retaining means includes a member extending through a bore in the first one of the bodies. The means for attaching defines a longitudinal axis and the bore defines a reference axis. A means is provided for aligning the longitudinal axis to be substantially coincident with the reference axis when the first one of the bodies is in the static position. The means for aligning includes a first portion attached to the means for attaching and a second portion attached to the first one of the bodies. The first portion and the second portion being engaged when the first one of the bodies is in the static position. A means is provided for biasing the first one of the bodies toward the static position.

As it can be seen, the embodiments presented herein provide several advantages. A connector body consistently returns to it nominal position when disengaged from the device being tested. The tolerance associated with the nominal position of the connector body is greatly reduced and does not significantly increase over extended periods of time and operation. Tooling pins are not needed to accomplish precision alignment. The useful life of the test fixture is extended due to reduced binding between the connector body and the device being tested. The wires attached to the connector body do not adversely affect the floating or self-centering functionality of the connector body. The longevity of the floating and self-centering functionality of the test apparatus is enhanced.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A through connector test apparatus, comprising:
    a connector body;
    a fixture body positioned adjacent to a first side of the connector body;
    a retaining member extending through the fixture body, a first end of the retaining member attached to the connector body;
    a head on a second end of the retaining member, the head including a tapered portion engaging a tapered seat on the fixture body;
    a first recess formed in the connector body;
    a second recess formed in the fixture body; and
    a resilient member having a portion seated in the first recess and another portion seated in the second recess, the resilient member being compressed between the connector body and the fixture body.

2. The apparatus of claim 1 wherein the retaining member defines a longitudinal axis, wherein the connector body is movable between a static position and a displaced position in a direction generally parallel to the longitudinal axis and wherein the connector body is movable in a radial direction with respect to the longitudinal axis of the retaining member when the connector body is moved toward the displaced position.

3. The apparatus of claim 2 wherein the connector body is offset from the fixture body by an offset distance when the connector body is in the static position.

4. The apparatus of claim 1 wherein the tapered portion of the head and the tapered seat have mating conical surfaces.

5. The apparatus of claim 1 further comprising:
    a plurality of probes extending through the connector body.

6. The apparatus of claim 1 wherein the connector body is made of a non-conductive polymeric material.

7. The apparatus of claim 1 further comprising:
    an alignment pin extending axially through the retaining member along a longitudinal axis of the retaining member, the pin including a shaft, a flange attached to the shaft and an end protruding from the connector body opposite the fixture body.

8. The apparatus of claim 7 further comprising:
    a helically wound spring mounted in the retaining member and compressed between the flange of the alignment pin and the head of the retaining member.

9. The apparatus of claim 1 wherein the first end of the retaining member includes a threaded portion engaged with a corresponding threaded portion in the fixture body.

10. The apparatus of claim 1 wherein the resilient member is a helically wound spring.

11. A connector test apparatus, comprising:
    a plurality of bodies, a first one of the bodies being spaced apart from a second one of the bodies;
    a retaining member extending through the first one of the bodies, a first end of the retaining member maintained in fixed relationship with respect to the second one of the bodies;
    a head on a second end of the retaining member, the head including a self-centering portion engaging a mating self-centering portion attached to the first one of the bodies;
    a first recess formed in the first one of the bodies;
    a second recess formed in the second one of the bodies; and
    a resilient member biasing the self-centering portion of the first one of the bodies into engagement with the self-centering portion of the head, the resilient member having a portion seated in the first recess and another portion seated in the second recess, the resilient member being compressed between the first and second bodies.

12. The apparatus of claim 11 wherein the retaining member defines a longitudinal axis, wherein the first one of the bodies is movable between a static position and a displaced position in a direction generally parallel to the longitudinal axis and wherein the first one of the bodies is movable in a radial direction with respect to the longitudinal axis of the retaining member when the first one of the bodies is moved toward the displaced position.

13. The apparatus of claim 12 wherein the first one of the bodies is offset from the second one of the bodies by an offset distance when the first one of the bodies is in the static position.

14. The apparatus of claim 11 wherein the self-centering portion of the retaining member and mating self-centering portion attached to the first one of the bodies include mating conical surfaces.

15. The apparatus of claim 11 wherein the first end of the retaining member includes a threaded portion engaged with a corresponding threaded portion in the second one of the bodies.

16. The apparatus of claim 11 wherein the resilient member is a helically wound spring.

17. The apparatus of claim 11 wherein the first one of the bodies includes a connector body portion.

* * * * *